United States Patent
Hrehor et al.

(10) Patent No.: US 10,854,848 B1
(45) Date of Patent: Dec. 1, 2020

(54) FLEXIBLE DEVICE HAVING GLASS WITH ANTIGLARE SELF-HEALING POLYMER SURFACE

(71) Applicant: DELL PRODUCTS, LP, Round Rock, TX (US)

(72) Inventors: Robert Duane Hrehor, Round Rock, TX (US); Brian J. Yates, Cedar Park, TX (US); Deeder M. Aurongzeb, Austin, TX (US)

(73) Assignee: Dell Products, L.P., Round Rock, TX (US)

( * ) Notice: Subject to any disclaimer, the term of this patent is extended or adjusted under 35 U.S.C. 154(b) by 0 days.

(21) Appl. No.: 16/531,447

(22) Filed: Aug. 5, 2019

(51) Int. Cl.
H01L 51/52 (2006.01)
H01L 51/00 (2006.01)

(52) U.S. Cl.
CPC ...... H01L 51/5256 (2013.01); H01L 51/0097 (2013.01)

(58) Field of Classification Search
CPC .......................... H01L 51/0097; H01L 51/5256
See application file for complete search history.

(56) References Cited

U.S. PATENT DOCUMENTS

| 10,241,377 | B1* | 3/2019 | Wang | G02F 1/167 |
| 2010/0125113 | A1* | 5/2010 | Xiao | C08G 59/226 |
| | | | | 523/468 |
| 2017/0092897 | A1* | 3/2017 | Liu | H01L 51/004 |
| 2018/0030369 | A1* | 2/2018 | Burrington | C10M 139/00 |
| 2018/0177046 | A1* | 6/2018 | Wald | H01L 51/0097 |
| 2019/0022980 | A1* | 1/2019 | Chu | H01L 51/0097 |
| 2020/0040184 | A1* | 2/2020 | El-Said | C08K 3/041 |
| 2020/0061967 | A1* | 2/2020 | Cho | B32B 27/08 |

OTHER PUBLICATIONS

Blaiszik, B.J., "Self-Healing Polymers and Composites," Department of Materials Science and Engineering Annual Review of Materials Research, vol. 40, Apr. 5, 2010, pp. 179-211, https://www.researchgate.net/profile/Sharlotte_Kramer/publication/228660410_Self-Healing_Polymers_and_Composites/ links/56322f8708ae13bc6c381ab5/Self-Healing-Polymers-and-Composites.pdf.

Fogarty, Kevin, "Screen protector designed to stay clear by healing its own scratches," ITWorld, from IDG, CoreIT, Apr. 9, 2012, pp. 1-2, https://www.itworld.com/article/2728594/screen-protector-designed-to-stay-clear-by-healing-its-own-scratches.html.

* cited by examiner

*Primary Examiner* — Dung A. Le
(74) *Attorney, Agent, or Firm* — Larson Newman, LLP

(57) ABSTRACT

An information handling system includes an organic light emitting diode layer, an optically clear adhesive layer, and a flexible glass substrate. A surface film includes a self-healing polymer layer, the self-healing polymer layer including a self-healing polymer.

17 Claims, 3 Drawing Sheets

FLEXIBLE DEVICE HAVING GLASS WITH ANTIGLARE SELF-HEALING POLYMER SURFACE

FIELD OF THE DISCLOSURE

The present disclosure generally relates to information handling systems, and more particularly relates to flexible devices having glass with an antiglare self-healing polymer surface.

BACKGROUND

As the value and use of information continues to increase, individuals and businesses seek additional ways to process and store information. One option is an information handling system. An information handling system generally processes, compiles, stores, or communicates information or data for business, personal, or other purposes. Technology and information handling needs and requirements can vary between different applications. Thus information handling systems can also vary regarding what information is handled, how the information is handled, how much information is processed, stored, or communicated, and how quickly and efficiently the information can be processed, stored, or communicated. The variations in information handling systems allow information handling systems to be general or configured for a specific user or specific use such as financial transaction processing, airline reservations, enterprise data storage, or global communications. In addition, information handling systems can include a variety of hardware and software resources that can be configured to process, store, and communicate information and can include one or more computer systems, graphics interface systems, data storage systems, networking systems, and mobile communication systems. Information handling systems can also implement various virtualized architectures. Data and voice communications among information handling systems may be via networks that are wired, wireless, or some combination.

SUMMARY

A information handling system may include an organic light emitting diode layer, an optically clear adhesive layer, and a flexible glass substrate. A surface film can include a self-healing polymer layer having a self-healing polymer.

BRIEF DESCRIPTION OF THE DRAWINGS

It will be appreciated that for simplicity and clarity of illustration, elements illustrated in the Figures are not necessarily drawn to scale. For example, the dimensions of some elements may be exaggerated relative to other elements. Embodiments incorporating teachings of the present disclosure are shown and described with respect to the drawings herein, in which.

The use of the same reference symbols in different drawings indicates similar or identical items.

DETAILED DESCRIPTION OF THE DRAWINGS

The following description in combination with the Figures is provided to assist in understanding the teachings disclosed herein. The description is focused on specific implementations and embodiments of the teachings, and is provided to assist in describing the teachings. This focus should not be interpreted as a limitation on the scope or applicability of the teachings.

Figure 1:
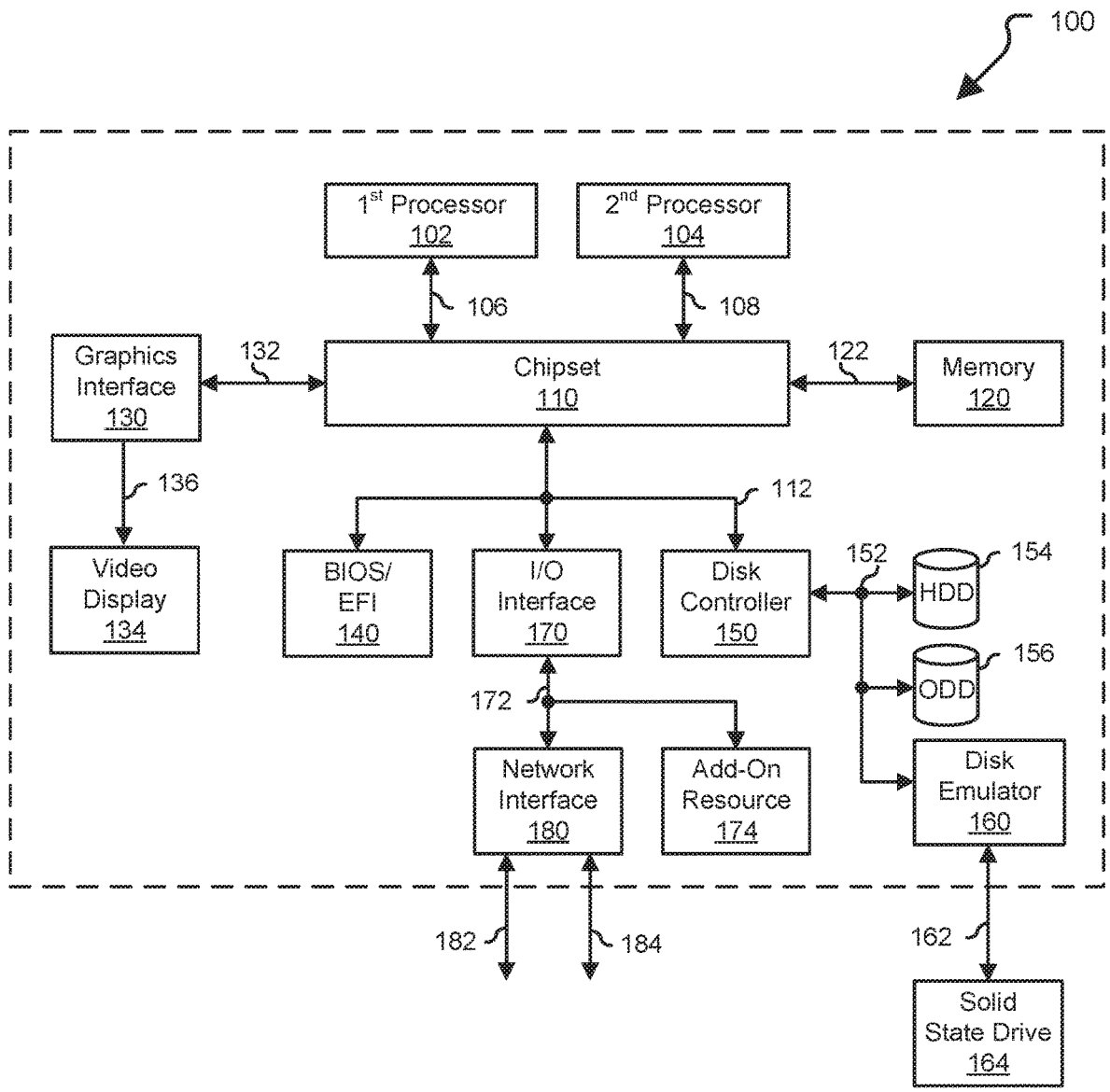
FIG. 1 is a block diagram illustrating an information handling system according to an embodiment of the present disclosure.

FIG. 1 illustrates a generalized embodiment of information handling system 100. For purpose of this disclosure information handling system 100 can include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, information handling system 100 can be a personal computer, a laptop computer, a smart phone, a tablet device or other consumer electronic device, a network server, a network storage device, a switch router or other network communication device, or any other suitable device and may vary in size, shape, performance, functionality, and price. Further, information handling system 100 can include processing resources for executing machine-executable code, such as a central processing unit (CPU), a programmable logic array (PLA), an embedded device such as a System-on-a-Chip (SoC), or other control logic hardware. Information handling system 100 can also include one or more computer-readable medium for storing machine-executable code, such as software or data. Additional components of information handling system 100 can include one or more storage devices that can store machine-executable code, one or more communications ports for communicating with external devices, and various input and output (I/O) devices, such as a keyboard, a mouse, and a video display. Information handling system 100 can also include one or more buses operable to transmit information between the various hardware components.

Information handling system 100 can include devices or modules that embody one or more of the devices or modules described above, and operates to perform one or more of the methods described above. Information handling system 100 includes a processors 102 and 104, a chipset 110, a memory 120, a graphics interface 130, include a basic input and output system/extensible firmware interface (BIOS/EFI) module 140, a disk controller 150, a disk emulator 160, an input/output (I/O) interface 170, and a network interface 180. Processor 102 is connected to chipset 110 via processor interface 106, and processor 104 is connected to chipset 110 via processor interface 108. Memory 120 is connected to chipset 110 via a memory bus 122. Graphics interface 130 is connected to chipset 110 via a graphics interface 132, and provides a video display output 136 to a video display 134. In a particular embodiment, information handling system 100 includes separate memories that are dedicated to each of processors 102 and 104 via separate memory interfaces. An example of memory 120 includes random access memory (RAM) such as static RAM (SRAM), dynamic RAM (DRAM), non-volatile RAM (NV-RAM), or the like, read only memory (ROM), another type of memory, or a combination thereof.

BIOS/EFI module 140, disk controller 150, and I/O interface 170 are connected to chipset 110 via an I/O channel 112. An example of I/O channel 112 includes a Peripheral Component Interconnect (PCI) interface, a PCI-Extended (PCI-X) interface, a high-speed PCI-Express (PCIe) interface, another industry standard or proprietary communication interface, or a combination thereof. Chipset 110 can also include one or more other I/O interfaces, including an Industry Standard Architecture (ISA) interface, a Small Computer Serial Interface (SCSI) interface, an Inter-Integrated Circuit (I2C) interface, a System Packet Interface (SPI), a Universal Serial Bus (USB), another interface, or a combination thereof. BIOS/EFI module 140 includes BIOS/EFI code operable to detect resources within information handling system 100, to provide drivers for the resources, initialize the resources, and access the resources. BIOS/EFI module 140 includes code that operates to detect resources within information handling system 100, to provide drivers for the resources, to initialize the resources, and to access the resources.

Disk controller 150 includes a disk interface 152 that connects the disc controller to a hard disk drive (HDD) 154, to an optical disk drive (ODD) 156, and to disk emulator 160. An example of disk interface 152 includes an Integrated Drive Electronics (IDE) interface, an Advanced Technology Attachment (ATA) such as a parallel ATA (PATA) interface or a serial ATA (SATA) interface, a SCSI interface, a USB interface, a proprietary interface, or a combination thereof. Disk emulator 160 permits a solid-state drive 164 to be connected to information handling system 100 via an external interface 162. An example of external interface 162 includes a USB interface, an IEEE 1194 (Firewire) interface, a proprietary interface, or a combination thereof. Alternatively, solid-state drive 164 can be disposed within information handling system 100.

I/O interface 170 includes a peripheral interface 172 that connects the I/O interface to an add-on resource 174 and to network interface 180. Peripheral interface 172 can be the same type of interface as I/O channel 112, or can be a different type of interface. As such, I/O interface 170 extends the capacity of I/O channel 112 when peripheral interface 172 and the I/O channel are of the same type, and the I/O interface translates information from a format suitable to the I/O channel to a format suitable to the peripheral channel 172 when they are of a different type. Add-on resource 174 can include a data storage system, an additional graphics interface, a network interface card (NIC), a sound/video processing card, another add-on resource, or a combination thereof. Add-on resource 174 can be on a main circuit board, on separate circuit board or add-in card disposed within information handling system 100, a device that is external to the information handling system, or a combination thereof.

Network interface 180 represents a NIC disposed within information handling system 100, on a main circuit board of the information handling system, integrated onto another component such as chipset 110, in another suitable location, or a combination thereof. Network interface device 180 includes network channels 182 and 184 that provide interfaces to devices that are external to information handling system 100. In a particular embodiment, network channels 182 and 184 are of a different type than peripheral channel 172 and network interface 180 translates information from a format suitable to the peripheral channel to a format suitable to external devices. An example of network channels 182 and 184 includes InfiniBand channels, Fibre Channel channels, Gigabit Ethernet channels, proprietary channel architectures, or a combination thereof. Network channels 182 and 184 can be connected to external network resources (not illustrated). The network resource can include another information handling system, a data storage system, another network, a grid management system, another suitable resource, or a combination thereof.

Figure 2:
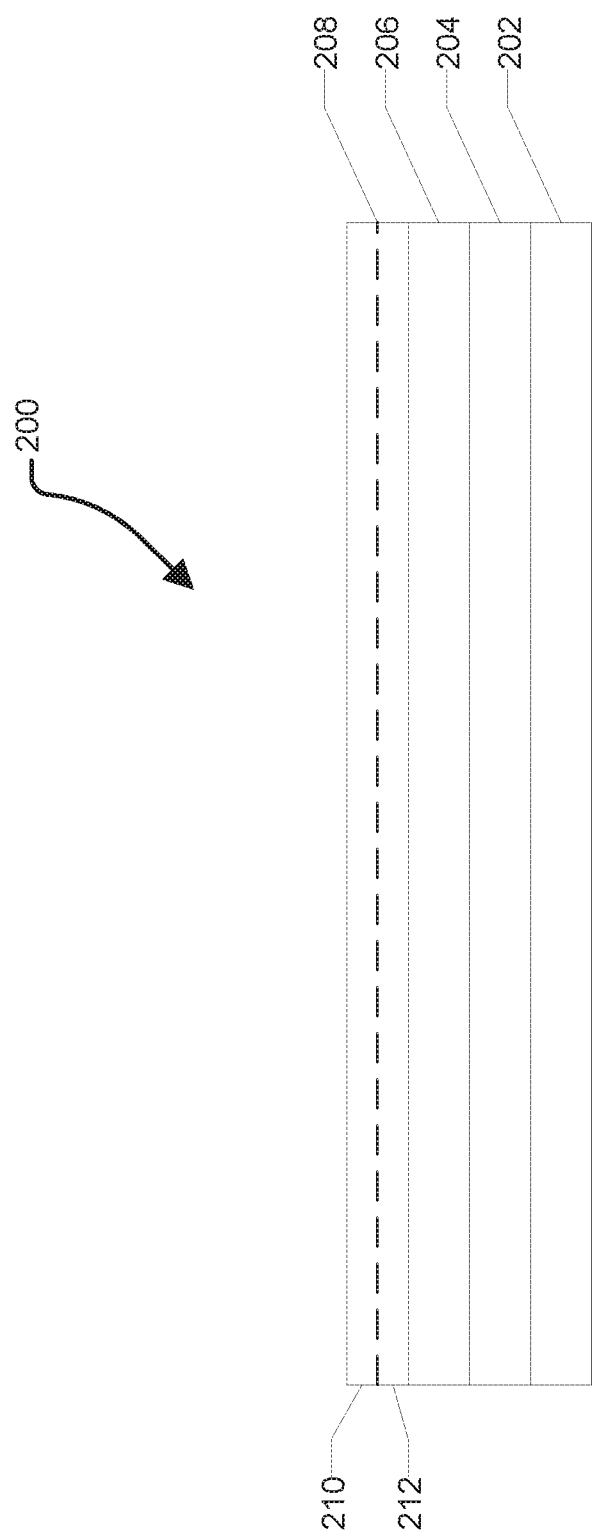
FIG. 2 is a cross-sectional view illustrating an exemplary display structure according to an embodiment of the present disclosure.

FIG. 2 shows a flexible display structure 200 including an organic light emitting diode (OLED) layer 202, an optically clear adhesive layer 204, a flexible glass substrate 206, and a surface film 208. In various embodiments, the display structure can be foldable and incorporated into a device such as a laptop, foldable tablet, or foldable display extending across a hinge region. The flexible display structure 200 can bend with the device without breaking.

In various embodiments, the OLED layer 202 can include a film of organic compound that emits light in response to an electric current. The organic layer can be situated between two electrodes. In particular embodiments, at least one of these electrodes can be transparent. The OLED layer can be driven with a passive-matrix (PMOLED) or active-matrix (AMOLED) control scheme. In the PMOLED scheme, each row (and line) in the display is controlled sequentially, one by one, whereas AMOLED control uses a thin-film transistor backplane to directly access and switch each individual pixel on or off, allowing for higher resolution and larger display sizes.

In various embodiments, the optically clear adhesive 204 can bond the OLED layer 202 to the flexible glass substrate 206. The optically clear adhesive can enhance the performance of the display by eliminating air gaps between the flexible glass substrate 206 and the OLED layer 202. In various embodiments, the optically clear adhesive can improve the anti-reflective and anti-glare properties of the display reducing the amount of reflected light and improving the contrast ratio. Fresnel reflections from the glass as well as the adhesive can degrade LCD viewability. The reflections can be caused by an impedance mismatch between air and the glass. The optically clear adhesive can match the refractive index of flexible glass substrate 206 to minimize loss and reflection. Additionally, bonding the OLED layer to the flexible glass substrate 206 using the optically clear adhesive can display durability. In various embodiments, the optically clear adhesive can be an elastomer and attenuate the pressure applied to the OLED layer 202.

The flexible glass substrate 206 can have a thickness of not greater than about 200 microns, such as not greater than about 150 microns, such as not greater than about 100 microns. Reducing the thickness of glass can reduce the force needed to bend the glass. In various embodiments, the flexible glass substrate 206 can be chemically modified to increase the yield point. The yield number corresponds to the maximum force the glass can withstand without breaking. The combination of reducing the thickness and increasing the yield number can result in a flexible glass that can bend back on itself. While it can be possible for the glass to bend, the glass can have a minimum bend radius of not greater than about 40 mm, such as not greater than about 10 mm, even not greater than about 5 mm. In various embodiments, the minimum bend radius can be measured by bending the flexible glass substrate 206 to determine the bend radius at which it breaks. Similarly, measuring the yield point can measure the force required to bend the glass to the point it breaks.

The surface film 208 can include a self-healing polymer layer 210 and, optionally, an elastomer layer 212. The elastomer layer 212, when present, can be positioned between the self-healing polymer layer 210 and the flexible glass substrate 206 leaving the self-healing polymer layer 210 positioned at the exposed surface of the flexible display structure 200. The surface film 208 can have a low index of refraction to minimize optical distortions. As with the optically clear adhesive, closely matching the index of refraction to that of the flexible glass substrate 206.

In various embodiments, self-healing polymer layer 210 can include a self-healing polymer and antiglare beads. The self-healing polymer layer 210 can have a thickness of between about 10 nanometers and about 500 nanometers. Additionally, the self-healing polymer layer 210 can have a dynamic coefficient of friction of at least 0.1, such as between about 0.1 and about 0.5. The dynamic coefficient of friction may be such that the movement of a stylus across the surface of the self-healing polymer layer 210 can feel more like the movement of a pen on paper than a stylus sliding across glass. In various embodiments, the self-healing polymer layer 210 can have a low surface energy making the self-healing polymer layer 210 resistant to fingerprints. In various embodiments, the antiglare beads can have a diameter of between about 10 nanometers and about 70 nanometers.

The self-healing polymer layer 210 can be a capsule-based self-healing material, a vascular self-healing material, or an intrinsic self-healing material. Capsule-based and vascular self-healing materials can include internal structures (such as capsules or a network of channels) to sequester one or more self-healing agent. Damage to the structure can release the self-healing agent to fill and repair the damage. Alternatively, intrinsic self-healing materials achieve the self-healing through intrinsic reversibility of the bonding in the polymer matrix. In various embodiments, the self-healing process may require external environmental factors, such as humidity, increased temperature, light, or any combination thereof to affect the self-healing. In a preferred embodiment, a humidity based self-healing polymer can be desirable as the healing can occur when the device is closed (display not exposed to light) and off (device and display are cool).

The flexible glass substrate 206 can be subject to breakage, such as due to impacts and over bending. In various embodiments, the surface film 208 can substantially contain glass shards in the event of breakage. In particular, if the breakage occurs while the flexible glass substrate 206 is bent, the strain on the glass at the bend can force the glass shards outward. Without the surface film 206, the glass shards could either be lifted at one end resulting in sharp edges/splitters on the display surface or the glass shards could be expelled from the flexible glass substrate 206 completely. The surface film 208 can provide a barrier to prevent the escape of the glass shards as well as protection from sharp edges caused by partial lifting.

In various embodiments, the optional elastomer layer can have a thickness of between about 1 micron and about 10 microns. In various embodiments, the ratio of the thickness of the flexible glass substrate 206 and the thickness of the surface film can be greater than 1, such as at least about 10, even at least about 100. In various embodiments, flexible display structure 200 can incorporate a touch sensitive layer (not shown) such as between OLED layer 202 and flexible glass substrate 206.

In various embodiments, a flexible ink can be printed onto a surface of the flexible glass substrate 206. Traditional inks for printing on glass may crack when bending the flexible display structure 200, resulting in unsightly imperfections near the bend region. Using a flexible ink that can flex with the bending of the flexible display structure 200 can avoid this problem.

TABLE 1

| Material | Transmission [%] | Refractive Index | Haze [%] |
| --- | --- | --- | --- |
| Polycarbonate (PC) | 86-91 | 1.584-1.586 | 0.2-2.7 |
| Poly(methyl methacrylate) (PMMA) | 89-92 | 1.49 | 0.10-2.6 |
| Polyethylene terephthalate (PET) | 87-92.1 | 1.575 | 0.20-5.1 |
| Polyethylene terephthalate glycol-modified (PETG) | 92 | 1.55 | 0.7 |
| Clear polyvinyl chloride (PVC) | Up to 97% | 1.381 | 2.5 |
| Liquid Silicone Rubber (LSR) | 94 | 1.41 | <1 |
| Cyclic olefin copolymer (COC) | 91 | 1.53 | 3 |
| Ionomer Resin | 93.4 | 1.49 | 2.7-4.2 |
| Fluorinated ethylene propylene (FEP) | 92 | 1.55 | 0.7 |
| Styrene methyl methacrylate (SMMA) | 89-92.8 | 1.59 | 0.3-1.0 |
| Styrene-Acrylonitrile (SAN) | 86.2-89.3 | 1.57 | 0.4-2.8 |
| General purpose polystyrene (GPPS) | 88-90 | 1.6 | 0.3-1.1 |
| Transparent Acrylonitrile Butadiene Styrene (ABS) | 86 | 1.52 | 3 |

The various polymer layers (optically clear adhesive 204, self-healing polymer layer 210, and elastomer layer 212) can have a high transmission %, a refractive index that closely matches the glass, and a low haze. Using polymers that do not meet these criteria can reduce the quality of the display, such as by reducing brightness (low transmission), decreasing apparent resolution (high haze), causing visual distortions (unmatched refractive index) or any combination thereof. In particular embodiments, the haze can be not greater than 7%, such as not greater than 5%. Table 1 lists the optical properties of various polymers that can be suitable for use in display structures.

Figure 3A:
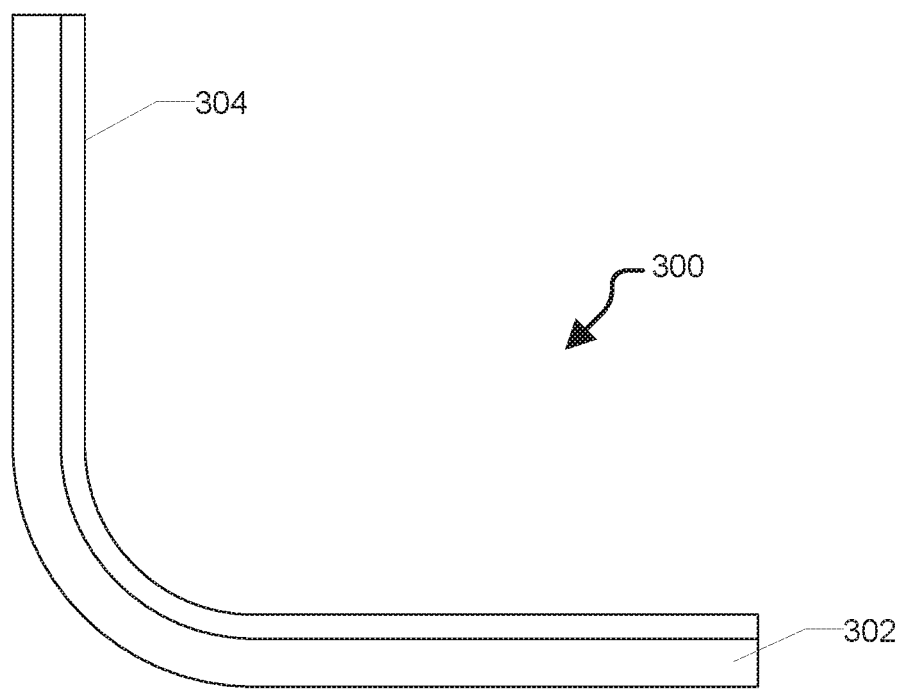
FIGS. 3A and 3B are cross-sectional views illustrating an exemplary flexible device according to an embodiment of the present disclosure.
Figure 3B:
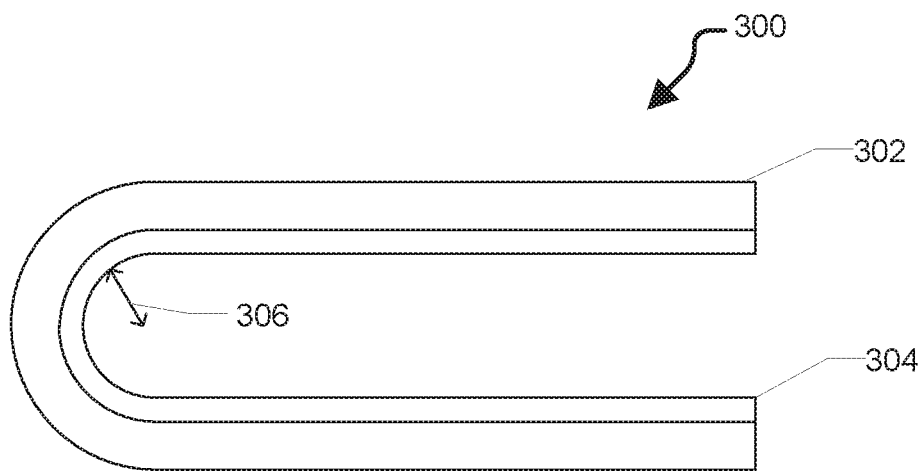

FIGS. 3A and 3B show an exemplary foldable device 300 that includes a chassis 302 and a flexible display structure 304. The foldable device 300 can be positioned in an open orientation (FIG. 3A) or a closed orientation (FIG. 3B) and various orientations therebetween. In various embodiments, the foldable device can be positioned in an extended orientation (not shown) so as to lay or extend in a substantially flat manner.

Chassis 302 can house various components of the foldable device 300 such as processors, memory, storage, power supplies, battery power, and the like. In various embodiments, foldable device 300 can be an information handling system, such as information handling system 100.

Flexible display structure 304 can be similar to flexible display structure 200. In various embodiments, flexible display structure 304 can also be a touchscreen device by incorporation of a touch sensitive layer. In this way, flexible display structure can perform the functions of a video display and an input device.

In various embodiments, the chassis 302 can substantially prevent the flexible display structure 304 from going beyond the minimum bend radius of the flexible glass substrate. For example, in the closed configuration, the flexible display structure 304 can maintain a radius of curvature 306 greater than the minimum bend radius of the flexible glass substrate. The present disclosure thus provides foldable glass with an antiglare self-healing polymer surface for optical and mechanical integrity for foldable devices.

Although only a few exemplary embodiments have been described in detail above, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

What is claimed is:

1. An information handling system, comprising:
    a processor in communication with an organic light emitting diode layer;
    an optically clear adhesive layer;
    a flexible glass substrate; and
    a surface film including a self-healing polymer layer, the self-healing polymer layer including a self-healing polymer, the surface film includes an elastomer layer positioned between the flexible glass substrate and the self-healing polymer layer.

2. The information handling system of claim 1, wherein the optically clear adhesive layer includes an elastomer.

3. The information handling system of claim 1, wherein the self-healing polymer layer includes antiglare particles.

4. The information handling system of claim 3, wherein the antiglare particles have a diameter of between about ten nm and about seventy nm.

5. The information handling system of claim 1, wherein self-healing polymer layer has a thickness between about ten nm and about five hundred nm.

6. The information handling system of claim 1, wherein the surface film has a dynamic coefficient of friction of between about 0.1 and about 0.5.

7. The information handling system of claim 1, wherein the self-healing polymer is a humidity activated self-healing polymer, a thermally activated self-healing polymer, a photo activated self-healing polymer, or any combination thereof.

8. The information handling system of claim 1, wherein the flexible glass has a thickness of less than about one hundred fifty microns.

9. The information handling system of claim 1, wherein the ratio of the thickness of the flexible glass to a thickness of the surface film is between about one and about one hundred.

10. The information handling system of claim 1, wherein the flexible glass has a minimum bend radius of less than about fifty mm.

11. A flexible display, comprising:
    an organic light emitting diode layer;
    an optically clear adhesive layer;
    a flexible glass substrate; and
    a surface film including a self-healing polymer layer, the self-healing polymer layer including a self-healing polymer, wherein the self-healing polymer layer includes antiglare particles having a diameter of between about 10 nm and about 70 nm.

12. The flexible display of claim 11, wherein the optically clear adhesive layer includes an elastomer.

13. The flexible display of claim 11, wherein the surface film includes an elastomer layer positioned between the flexible glass substrate and the self-healing polymer layer.

14. The flexible display of claim 11, wherein self-healing polymer layer has a thickness between about 10 nm and about 500 nm.

15. The flexible display of claim 11, wherein the surface film has a dynamic coefficient of friction of between about 0.1 and about 0.5.

16. The flexible display of claim 11, wherein the surface film has a haze of not greater than 7%.

17. A flexible display, comprising:
    an organic light emitting diode layer;
    an optically clear adhesive layer;
    a flexible glass substrate; and
    a surface film including a self-healing polymer layer and an elastomer layer positioned between the flexible glass substrate and the self-healing polymer layer, the self-healing polymer layer including a self-healing polymer;
    wherein the flexible glass has a thickness of less than about 150 microns;
    wherein the ratio of the thickness of the flexible glass to a thickness of the surface film is between about 1 and about 100, and wherein the flexible glass has a minimum bend radius of less than about 50 mm.

\* \* \* \* \*